United States Patent [19]
Rowe et al.

[11] Patent Number: 5,793,808
[45] Date of Patent: Aug. 11, 1998

[54] DIGITAL PROCESSING APPARATUS AND METHOD TO CONTROL MULTIPLE PULSE WIDTH MODULATION DRIVERS

[75] Inventors: Jeffrey D. Rowe; David A. Bailey, both of Glendale; Robert R. Kost, Peoria, all of Ariz.

[73] Assignee: Honeywell Inc., Minneapolis, Minn.

[21] Appl. No.: 579,324

[22] Filed: Dec. 27, 1995

[51] Int. Cl.[6] .................... H03K 7/08; H03K 9/08
[52] U.S. Cl. .................. 375/238; 364/140; 395/842
[58] Field of Search ............................ 364/140, 141, 364/178, 431.054, 431.061; 395/842; 375/238

[56] References Cited

U.S. PATENT DOCUMENTS

| | | | |
|---|---|---|---|
| 4,759,590 | 7/1988 | Uchida et al. | 303/106 |
| 4,892,072 | 1/1990 | Miwa et al. | 123/340 |
| 5,024,199 | 6/1991 | Abe | 123/489 |
| 5,086,745 | 2/1992 | Nishimura et al. | 123/494 |
| 5,313,607 | 5/1994 | Tokumara | 395/425 |
| 5,452,432 | 9/1995 | Macachor | 395/425 |
| 5,513,096 | 4/1996 | Casler, Jr. et al. | 364/140 |
| 5,590,035 | 12/1996 | Shimomura et al. | 364/177 |
| 5,638,801 | 6/1997 | Maki et al. | 123/674 |
| 5,655,151 | 8/1997 | Bowes et al. | 395/842 |

*Primary Examiner*—Stephen Chin
*Assistant Examiner*—Mohammad Ghayour
*Attorney, Agent, or Firm*—Charles J. Ungemach

[57] ABSTRACT

Apparatus and method for controlling a plurality of pulse width modulated devices from a single controller including condition sensors to input the controller, a logic unit to determine the error between the sensed values and the desired values of the conditions and a direct memory access unit which is digitally coded with the error values, the pulse width modulated device being connected to receive the outputs of the direct memory access unit and operable to control the conditions.

21 Claims, 2 Drawing Sheets

|    | A1 | A2 | A3 | A4 | A5 | A6 |       |
|----|----|----|----|----|----|----|-------|
|    | 1  | 1  | 1  | 1  | 1  | 1  | ~80   |
|    | 1  | 1  | 0  | 1  | 1  | 0  | ~82   |
|    | 1  | 0  | 0  | 1  | 1  | 0  | ~84   |
|    | 0  | 0  | 0  | 1  | 1  | 0  | ~86   |
|    | 0  | 0  | 0  | 0  | 1  | 0  | ~88   |
|    | 0  | 0  | 0  | 0  | 0  | 0  | ~90   |
A ⟵⟶ B
*Fig. 2*
|    | A1 | A2 | A3 | A4 | A5 | A6 |        |
|----|----|----|----|----|----|----|--------|
|    | 1  | 1  | 1  | 0  | 0  | 0  | ~80a   |
|    | 1  | 1  | 0  | 0  | 1  | 0  | ~82a   |
|    | 1  | 0  | 0  | 1  | 1  | 0  | ~84a   |
|    | 0  | 0  | 0  | 1  | 1  | 0  | ~86a   |
|    | 0  | 0  | 0  | 1  | 1  | 0  | ~88a   |
|    | 0  | 0  | 0  | 1  | 1  | 1  | ~90a   |
A ⟵⟶ B
*Fig. 4*
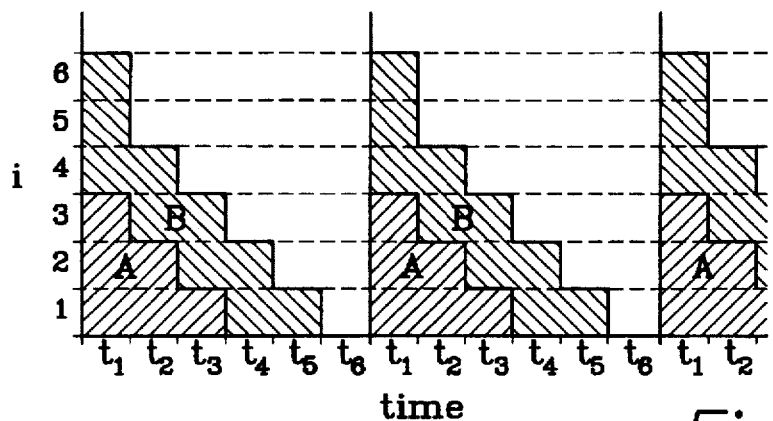
*Fig. 3*
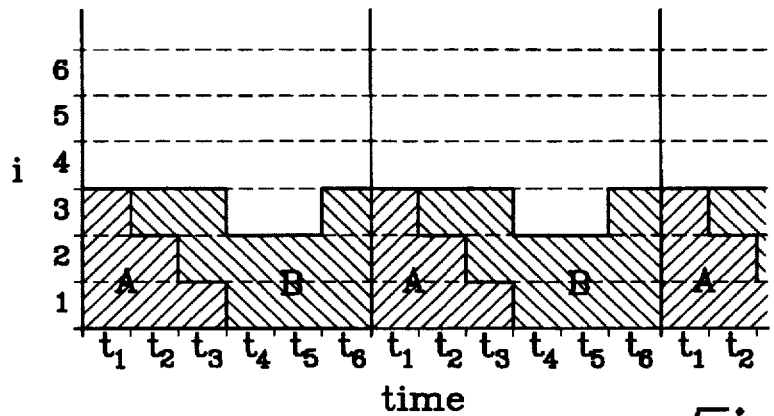
*Fig. 5*

DIGITAL PROCESSING APPARATUS AND METHOD TO CONTROL MULTIPLE PULSE WIDTH MODULATION DRIVERS

BACKGROUND OF INVENTION

1. Field of the Invention

In many applications, it is desirable to control a plurality of variables simultaneously. For example, a control system may maintain a predetermined temperature, control the level of sound and control the humidity of a home or business. In aircraft applications, it is desirable to control servo motors which adjust the angle of attack, altitude, yaw, and roll, etc. Other applications include platform stabilization where it is desirable to sense unwanted vibrations in each of a number of axes and provide counter vibrations to stabilize the platform. In such applications, system information is provided via multiple sensors to a controller which uses the error between desired and sensed conditions to calculate the actuator effort necessary to drive the system to the desired state. In some cases, actuators are pulse width modulated (PWM) so that the on and off times of the actuators produce the average actuator effort required. When a processor is used as the controller, outputs from the processor in the form of a series of logical "1's" and "0's" may be used so that a, for example, "1" turns the actuator on while a "0" turns the actuator off.

2. Description of the Prior Art

In the past, processors with specially designed outputs have been required in order to provide the necessary pulse width modulation signals. This has limited the choice of processors as well as the number of channels available for PWM control.

BRIEF DESCRIPTION OF THE INVENTION

Many common processors such as the Texas Instruments TMS320C3X contain a direct memory access (DMA) function which is used to access external memory in parallel with the execution of other processor functions. We have discovered that the direct memory access (DMA) function may be used alternately to control the pulse width modulation of multiple actuators simultaneously. In addition, since the DMA is designed to operate in parallel with other processor functions, the modulation function can be implemented with minimal impact to the computational efficiency of the processor.

BRIEF DESCRIPTION OF THE DRAWINGS

FIG. 2 shows a six by six matrix of one possible output from the DMA of FIG. 1;

FIG. 3 shows a graph of the application of the signals of FIG. 2;

FIG. 4 shows a six by six matrix of the outputs of FIG. 2 with current smoothing; and FIG. 5 shows a graph like FIG. 3 with the application of current smoothing.

DETAILED DESCRIPTION OF THE PREFERRED EMBODIMENTS

Figure 1:
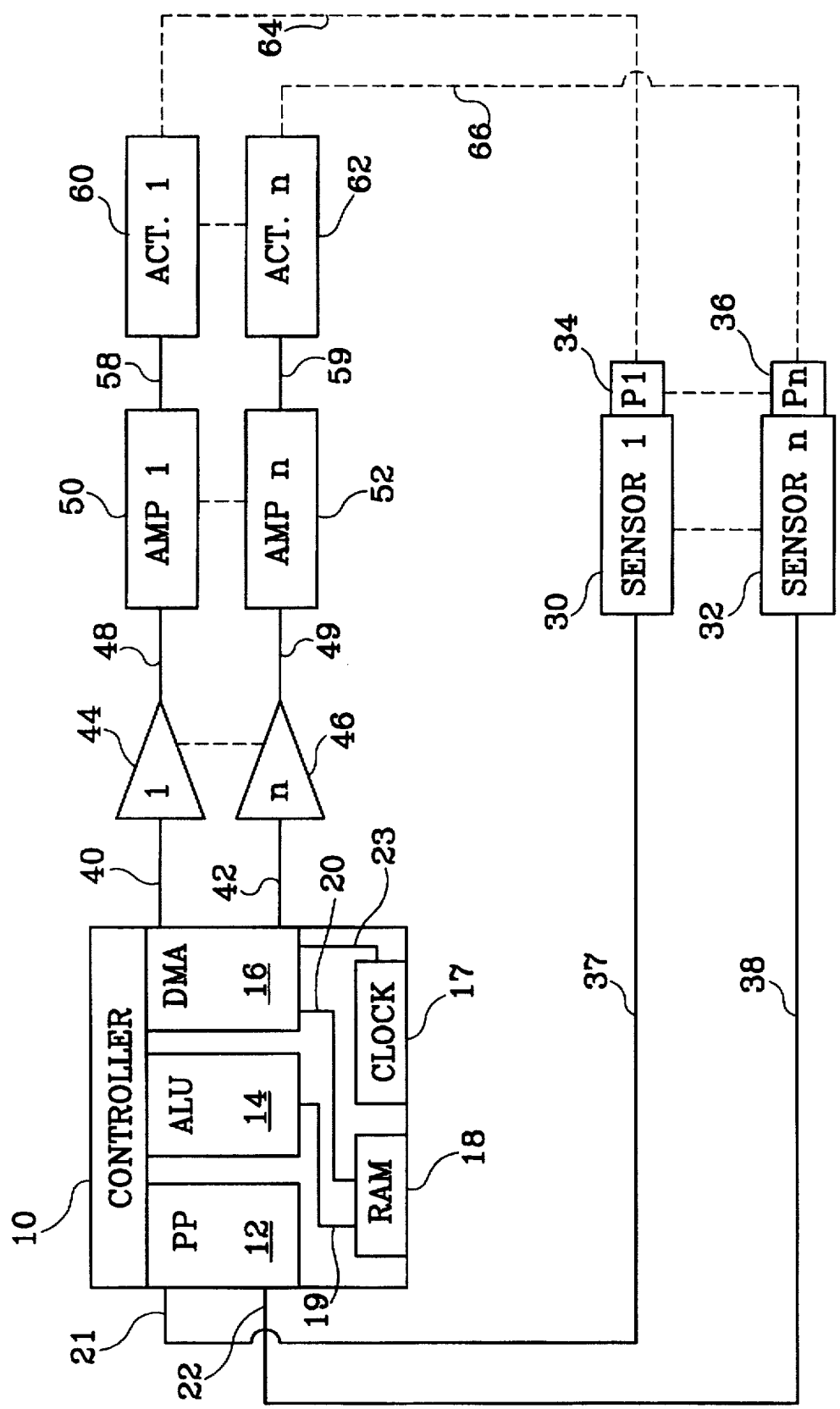
FIG. 1 shows a block diagram of the present invention.

In FIG. 1, a processor or controller such as the Texas Instrument TMS320C3X is shown by reference numeral 10. The standard architecture of the controller includes a parallel input port (PP) 12, an arithmetic logic unit (ALU) 14, a direct memory access (DMA) 16, a clock 17, a random access memory (RAM) 18, a primary data bus 19, and an expansion data bus 20. Port 12 receives input data from terminals such as 21 and 22. The ALU reads the input port 12, processes the data in accordance with a predetermined program, and writes the result to RAM 18 using the primary data bus 19. The DMA 16 then reads the data in RAM 18 and writes the data to the DMA 16 output using the expansion data bus 20. The normal function of the DMA is to read and write to memory independently so that the main processor does not have to wait for data retrieval from slower memory devices. The outputs from the DMA and the sampling of the parallel port 12 are timed by the clock 18 from signals conducted via a bus 23.

In FIG. 1, a plurality of sensors, 1 through n, are identified by reference numerals 30 and 32 and are used to sense the values of a plurality of conditions such as temperature, humidity, or vibration in various axes which may exist in a plurality of controlled devices or controllable environments such as plants 1 through n identified by reference numerals 34 and 36 with which sensors 30 and 32 are associated respectively. The output of the first sensor 30, indicative of a first condition being sensed in plant 34, is shown on a line 37 connected to input terminal 21 of controller 10 and the output of the nth sensor 32, indicative of another condition being sensed in plant 36, is shown on a line 38 connected to input terminal 22 of controller 10. There may, of course, be a number of other sensors for other conditions and a number of other inputs to port 12 but these have not been shown for simplicity.

The conditions transduced by the sensors 30-32 are read by the ALU 14 via the input port 12 at each sample period. The ALU 14 compares the sensor readings to the desired values and computes the required control effort in terms of a duty cycle according to the resident program. The ALU 14 then encodes the duty cycles for all of the actuators as a series of digital words. Each bit in a word corresponds to a single actuator. The value of each bit represents the desired state (ON/OFF) of the corresponding actuator. Each word represents the desired combination of actuator states at a particular time. These words are written in the desired chronological order to sequential memory locations in RAM 18 as will be discussed in connection with FIG. 2. The DMA then reads the digital words (representing the pulse width modulation) sequentially from RAM 18 and writes them to the output in DMA 16 using the expansion data bus 20. When the DMA 16 reaches the last digital word, the DMA is directed by the processor to repeat the sequence. A single cycle of the pulse width modulation (PWM is produced each time the DMA 16 completes this sequence. The DMA 16 continues producing the same set of duty cycles until the next sample period when the sequence of digital words stored in RAM 18 is updated. The encoding of multiple duty cycles as digital words which are stored in volatile memory and read by an independent DMA operation is a central concept of this invention.

DMA 16 writes to a plurality of output lines shown by reference numerals 40 and 42, and others (not shown) which present the PWM words to digital latching devices 1 through n shown by reference numerals 44 and 46. These latching devices retain the value of each word until the next PWM cycle. The latched signals are presented via a plurality of connectors such as lines 48 and 49 to a plurality of amplifiers, 1 through n shown by reference numerals 50 and 52. Amplifiers such as 50 and 52 are shown connected via a plurality of connectors shown by lines 58 and 59 to actuators 1 through n identified by reference numerals 60 and 62. Depending on the condition being controlled, actuators 60 and 62 apply control effort, such as torque, force, etc. to the plant(s) being controlled. These operations are shown in FIG. 1 by dashed lines 64 and 66 connected to the plants 34 and 36 respectively. The conditions being sensed in plants 34 and 36 change in accordance with he digital on/off operation called for by the pulse width modulation. Controller 10 will continue to receive signals from sensors 30 and 32 and will update the information in RAM 18 at each sample period. The DMA 16 will then read the new duty cycle data and write it to latches 40 and 42.

As an example, if the top of a platform is to be isolated from undesired vibrations at its base, sensor 30 may sense vibration in the x axis while sensor 32 may sense vibration in the y axis. Vibrations in other axes would be sensed by other sensors not shown. Controller 10 would receive these signals through input port 12 and provide the desired correction signals via DMA 16 to amplifiers 50 and 52. Actuators 60 and 62 would then apply the forces to, for example, linear magnetic actuators in plants 34 and 36, to provide counter vibrations in a direction and for a time necessary to nullify undesired vibrations.

FIG. 2 shows one possible sequence of digital PWM words stored in RAM 18. In this case, it is assumed that there are 6 conditions being controlled. Therefore, there are 6 controller outputs driving 6 actuators and 6 controller inputs received from 6 sensors. The condition being sensed by sensor 30 may cause Controller 10 to conclude that there is an error and that a 50% duty cycle should correct this. Assuming the PWM period contains 6 states, the desired PWM sequence for the first actuator is three ones followed by three zeros as shown in column A1 of FIG. 2. This set of signals will be fed in serial fashion to amplifier 50 causing actuator 60 to operate to change the condition of plant 34 which is sensed by sensor 30. The condition being sensed by another 4 sensors (not shown) may necessitate duty cycles in 4 other actuators (not shown). These duty cycles are stored in RAM 18 as shown in columns A2, A3, A4, and A5 of FIG. 2. The condition being sensed by sensor 32 may result in a duty cycle as shown in column A6 of FIG. 2. This signal will be serially presented on output 42 to amplifier 52 causing actuator 62 to operate to change the condition of plant 36 which is sensed by sensor 32. It is thus seen that the DMA function can be used to control a plurality pulse width modulated actuators simultaneously.

It should be noted that in the example of FIG. 2, the first digital PWM word, identified by reference numeral 80 in the top row, contains all ones indicating that all 6 actuators are commanded ON simultaneously. This corresponds to a peak in the power requirement for the system. The next word, identified by reference numeral 82, contains 4 ones and 2 zeros. The remaining words contain 3, 2, 1, and 0 logical ones, respectively. Thus the power consumption of the system exhibits large fluctuations which are typically undesirable. This can be seen in FIG. 3 where the current requirements (i) are plotted against time (t). It is seen that during the time t1, six units of currents are required; during the time t2, four units of current are required; during time t3, three units of current are required; during time t4, two units of current are required; during time t5, one unit of current is required; and during time t6, no units of current are required. This continues to occur for each repetition of the PWM cycle until the sensors indicate a different set of duty cycles is required. By identifying the first three columns of FIG. 2 by "A" and the last three columns by "B" the effect of the "A" and "B" contributions can be seen in FIG. 3 by the shaded portions "A" and "B".

To alleviate the problem of power fluctuations, the arrangement of the columns in FIG. 2 may be altered to give the same duty cycles but with the ON times staggered. Thus the power fluctuations may be smoothed by reversing the "B" or last three columns A4, A5, and A6 as shown in FIG. 4. In FIG. 4, rows 80–90 of FIG. 2 have been renumbered 80a–90a for convenience. By reversing the last three columns, row 80a now contains 3 ones and 3 zeros; row 82a contains 3 ones and 3 zeros; row 84a contains 3 ones and 3 zeros; row 86a contains 2 ones and 4 zeros; row 88a contains 2 ones and 4 zeros; and row 90a contains 3 ones and 3 zeros. The effect of this is seen in the graph of FIG. 5 where, as in FIG. 3, the contributions of the first three columns A1, A2, and A3 are again represented by regions marked "A" while the contributions of last three columns A4, A5 and A6 are again represented by regions marked "B". It is seen that the current requirement remains at 3 units except for times t4 and t5 where the current drops to 2 units. Thus the current requirements remain relatively steady throughout the pulse width modulation cycle. This is in sharp contrast to the fluctuations shown in FIG. 3. It should be noted that reversing the last three columns has been employed as an example and that reversing different combinations of columns will produce a similar smoothing effect. This technique can also be applied to systems with either more outputs or fewer outputs. The smoothing algorithm may be implemented using common programming techniques.

It is therefore seen that we have provided a controller which is operable to control a plurality of pulse width modulated actuators without hardware modification by a unique application of a direct memory access function. We have also implemented the pulse width modulation in a manner which minimizes abrupt changes in system current. Many modifications and alterations will occur to those skilled in the art. For example, while "1's" have to be used for turning "on" and "0's" for "off" the opposite may be employed. Furthermore, "on" and "off" actuations are not always required since the actuation may cause a variable to increase and decrease to provide condition control. Also while amplifiers 50–52 have been used, the outputs from latches 44–46 may, in some cases, be directly used to control actuators 60–62. We therefore do not wish to be limited to the specific disclosures used in connection with the preferred embodiments.

The embodiments of the invention in which an exclusive property or right is claimed are defined as follows:

1. Apparatus for controlling a plurality of conditions using a digital controller which has a DMA to produce a plurality of digital output bits each including a plurality of ones and zeros to form a pattern representing a desired duty cycle, comprising:

a plurality of actuators, one each connected to an output bit of the DMA and operable in accordance therewith to provide a plurality of actuation signals of the desired duty cycle; and a plurality of condition controllers, one each connected to one of the plurality of actuators and operable in accordance with the duty cycle of the actuation signals to control the plurality of conditions.

2. Apparatus according to claim 1 wherein the actuation signals are "on" or "off" and the condition controllers are pulse width modulators whereby the desired duty cycle operates to provide pulse width modulation for the condition controllers.

3. Apparatus according to claim 1 wherein the condition controllers change the plurality of conditions toward a predetermined desired value.

4. Apparatus according to claim 1 further including a plurality of condition sensors one each positioned to sense one of the conditions and to produce a condition value signal in accordance therewith.

5. Apparatus according to claim 3 further including a plurality of condition sensors one each positioned to sense one of the conditions and to produce a condition value signal in accordance therewith.

6. Apparatus according to claim 5 further including means connecting each condition sensor to the digital controller, the digital controller operating to compare the condition value signals with the desired values so as to provide the DMA with digital error signals for use by the DMA to produce the digital output bits.

7. Apparatus according to claim 6 wherein the DMA output bits are periodically transmitted to the actuators so as to cause the condition controllers to change the conditions being sensed by the condition sensors to reduce the digital error signals.

8. Apparatus according to claim 1 wherein each of the plurality of digital output bits of the DMA comprises a series of "1's" and "0's".

9. Apparatus according to claim 8 wherein the 1's operate to turn the condition controllers on and the 0's operate to turn the condition controllers off.

10. Apparatus for controlling a plurality of conditions using a digital controller which has a DMA to produce a plurality of digital output signals in the form of "1's" and "0's", comprising:

a plurality of actuators, one each connected to an output of the DMA and operable in accordance with the digital output signals to provide a plurality of actuation signals; and a plurality of condition sensors one each positioned to sense one of the conditions and to produce a condition value signal in accordance therewith;

means connecting each condition sensor to the digital controller, the digital controller operating to compare the condition value signals with the desired values so as to provide the DMA with digital error signals for use by the DMA as the digital output signals, wherein the signals are current smoothed to reduce the number of 1's that can occur simultaneously at the DMA outputs; and, a plurality of condition controllers, one each connected to one of the plurality of actuators and operable in accordance with the actuation signals to control the plurality of conditions towards a predetermined desired value.

11. Apparatus according to claim 10 wherein the current smoothing results from reversing the order of substantially half of the outputs of the DMA.

12. Apparatus according to claim 1 wherein all of the digital output bits from the DMA occur substantially simultaneously.

13. The method of controlling a plurality of conditions each having a sensor to produce a plurality of condition value outputs, by the use of a processor which includes an input and a DMA, comprising the steps of:

A. applying the condition value outputs to the input of the processor;

B. comparing the condition value outputs with a plurality of reference values to produce a plurality of error signals;

C. transferring the plurality of error signals to the DMA as a plurality of digital signals each having a plurality of ones and zeros indicative of a desired duty cycle; and D. periodically releasing the plurality of digital signals to a plurality of condition control devices to change the conditions to reduce the error signals.

14. The method of claim 13 wherein step D comprises:

D1. periodically releasing the plurality of digital signals to a plurality of actuators each having a control output; and D2. transmitting the control outputs of the actuators to a plurality of condition modifiers to change the condition to reduce the error signals.

15. The method of controlling a plurality of conditions each having a sensor to produce a plurality of condition value outputs, by the use of a processor which includes an input and a DMA, comprising the steps of:

A. applying the condition value outputs to the input of the processor;

B. comparing the condition value outputs with a plurality of reference values to produce a plurality of error signals;

C. transferring the plurality of error signals to the DMA as a plurality of digital signals:

C1. smoothing the outputs of the DMA so as to avoid excess current changes;

D1. periodically releasing the plurality of digital signals to a plurality of actuators each having a control output; and, D2. transmitting the control outputs of the actuators to a plurality of condition modifiers to change the condition to reduce the error signals.

16. The method of claim 15 wherein step C1 includes reversing substantially half of the plurality of digital signals.

17. A plurality of condition sensors each producing an output signal indicative of the magnitude of a controllable condition being sensed;

a controller having a plurality of input ports one each connected to receive one of the plurality of output signals respectively, having a logic unit to compare each of the output signals from the input ports with a desired reference value respectively and to provide a plurality of digital signals representing any such error, and having a DMA for receiving the plurality of digital signals and operable to substantially simultaneously release the digital signals as a series of digital words each representing the error to a plurality of output ports respectively, each digital word having a plurality of ones and zeros representing a desired duty cycle for correcting the error;

a plurality of actuators each connected to receive one of the digital words and to provide a plurality of "on" and "off" actuation signals in accordance with the desired duty cycle; and a plurality of condition controllers each connected to receive one of the plurality of actuation signals respectively and each controller operable to change one of the conditions being sensed respectively so as to reduce any error.

18. Apparatus according to claim 17 further including a plurality of latches one each connected to each output port to store the digital words and release them to the actuators periodically.

19. A plurality of condition sensors each producing an output signal indicative of the magnitude of a controllable condition being sensed:

a controller having a plurality of input ports one each connected to receive one of the plurality of output signals respectively, having a logic unit to compare each of the output signals from the input ports with a desired reference value respectively and to provide a plurality of digital signals representing any such error, and having a DMA for receiving the plurality of digital signals and operable to substantially simultaneously release the digital signals as a series of digital words each representing the error to a plurality of output ports respectively wherein the plurality of digital signals is current smoothed to reduce the number of "on" actuation signals that can occur simultaneously;

a plurality of actuators each connected to receive one of the digital words and to provide a plurality of "on" and "off" actuation signals in accordance therewith; and a plurality of condition controllers each connected to receive one of the plurality of actuation signals respectively and each controller operable to change one of the conditions being sensed respectively so as to reduce any error.

20. Apparatus according to claim 19 wherein the smoothing results from reversing substantially half of the digital words of the DMA.

21. A system for controlling a variable condition comprising:

a controller having an input port connected to receive a signal indicative of the condition, having a logic unit to compare the value of the signal at the input port with a desired reference value to provide a digital signal representing any error therebetween, and having a DMA for receiving the digital signal and operable to produce a digital word including a plurality of ones and zeros representing a desired duty cycle for correcting any such error;

an actuator connected to receive the digital word and to provide a plurality of "on" and "off" actuation signals in accordance the desired duty cycle; and a condition controller connected to receive the actuation signal and to change the variable condition to reduce any error.

* * * * *